United States Patent [19]
Hendrickson et al.

[11] Patent Number: 5,587,922
[45] Date of Patent: Dec. 24, 1996

[54] MULTIDIMENSIONAL SPECTRAL LOAD BALANCING

[75] Inventors: Bruce A. Hendrickson; Robert W. Leland, Albuquerque, both of N.M.

[73] Assignee: Sandia Corporation, Albuquerque, N.M.

[21] Appl. No.: 680,718

[22] Filed: Jul. 15, 1996

Related U.S. Application Data

[63] Continuation of Ser. No. 78,667, Jun. 16, 1993, abandoned.
[51] Int. Cl.$^6$ ............................. G06F 15/16; G06F 17/50
[52] U.S. Cl. ............................................ 364/489; 395/800
[58] Field of Search ................................. 364/488, 489, 364/490, 491; 395/800

[56] References Cited

U.S. PATENT DOCUMENTS 4,577,276   3/1986   Dunlop et al. ........................... 364/491

OTHER PUBLICATIONS

Suaris, Peter R., "An Algorithm for Quadrisection and Its Application to Standard Cell Placement," IEEE *Transactions on Circuits and Systems*, vol. 35, No. 3, pp. 294–302 (1988).

Tokuyama, Takeshi, et al, "Geometric Algorithms for a Minimum Cost Assignment Problem," *IBM Research, Tokyo Research Laboratory*, pp. 262–271 (1991).

Rendl, Franz, et al, "A Projection Technique for Partioning the Nodes of a Graph," *Research Report*, Cor 9020, (Nov. 1990).

Mohar, Bojan, "Laplace Eigenvalues of Graphs—A Survey," *Discrete Mathematics*, vol. 109, pp. 171–183 (1992).

Kernigham, B. W., et al, "An Efficient Heuristic Procedure for Partitioning Graphs," *Bell System Technical Journal*, vol. 49, pp. 291–307 (1970).

Hammond, Steven W., "Mapping Unstructured Grid Computations to Massively Parallel Computers," *Research Institute for Advanced Computer Science (NASA Ames Research Center)*, Technical Report 92.14 (Jun. 1992).

Mohar, Bojan, "The LaPlacian Spectrum of Graphs," *Intl. Conference on Theorp, Application of Graphs*, Kalamazoo, MI (1988).

Simon, Horst D., "Partitioning of Unstructured Problems for Parallel Processing," *NASA Ames Research Center*, Report PNR–91–008 (Feb. 1991).

Hendrickson, Bruce, et al, "Multidimensional Spectral Load Balancing," *Sandia National Laboratories Report*, SAND93–0074–UC–405 (Jan. 1993).

Hendrickson, Bruce, et al, "An Improved Spectral Graph Partitioning Algorithm for Mapping Parallel Computations," *Sandia National Laboratories Report*, SAND92–1460–UC–405 (Sep. 1992).

*Primary Examiner*—Vincent N. Trans
*Attorney, Agent, or Firm*—Timothy D. Stanley

[57] ABSTRACT

A method of and apparatus for graph partitioning involving the use of a plurality of eigenvectors of the Laplacian matrix of the graph of the problem for which load balancing is desired. The invention is particularly useful for optimizing parallel computer processing of a problem and for minimizing total pathway lengths of integrated circuits in the design stage.

13 Claims, 2 Drawing Sheets

MULTIDIMENSIONAL SPECTRAL LOAD BALANCING

GOVERNMENT RIGHTS

The U.S. Government has a paid-up license to this invention and the right in limited circumstances to require the patent owner to license others on reasonable terms.

This is a continuation of application Ser. No. 08/078,667; filed on Jun. 16, 1993, now abandoned.

BACKGROUND OF THE INVENTION

1. Field of the Invention (Technical Field)

The present invention relates to methods for partitioning graphs, including those to balance the workload of parallel computers, and those used to optimize the placement of circuits on an integrated circuit.

2. Background Art

A fundamental problem arising in both parallel computing and in circuit design is that of partitioning a graph into nearly equally sized sets of vertices such that the number of edges crossing between sets is small. The method of graph construction and the specific cost associated with cross-edges will necessarily vary with the application, but the essential underlying problem of partitioning the graph is common to both of these and many other scientific and engineering applications.

In the parallel computing context, the graph partitioning problem arises as presently described. In order to perform a computation on most parallel computers, the problem must be divided into pieces which are assigned to difference processors. A partitioning must have two specific properties to enable an efficient computation. First, a roughly equal amount of work must be assigned to each processor. Second, the quantity of information transmitted between processors must be kept small. The problem of finding a partitioning with theses properties can be phrased naturally in terms of a graph. The graph G=(V,E) consists of a set of vertices V, each of which corresponds to some unit computation, and a set of edges E which connect two vertices if the computation corresponding to one needs input from the other. The problem is now to partition the vertices of the graph into P sets of roughly equal cardinality such that the number of edges crossing between sets is small. Solving this problem optimally is known to be difficult, i.e., it is NP-complete. In the more general case, the vertices and edges are assigned relative weights to allow for more subtle modeling of the computation, and the problem becomes that of partitioning the graph such that the total of vertex weights assigned to each set is roughly equal and that the cumulative weight of edges crossing between sets is minimal.

The same graph partitioning problem arises in Very Large Scale Integration (VLSI) circuit layout. Here the circuit is typically modeled as a graph in which vertices represent circuit components and an edge connects any two vertices that are in the same net list. The objective is to place the circuit elements on a chip so as to minimize the total wiring length subject to a variety of engineering constraints on component area, wire routing, etc. Relative component areas may De represented in the general case by vertex weights, and the goal is to place the components on a chip in such a way as to minimize the chip area consumed. The standard way to address this problem is a divide-and-conquer approach in which the graph is partitioned to generate smaller subproblems.

Most previous methods for graph partitioning work by recursive bisection. The graph is halved, the halves are halved and so on. This is a convenient simplification because it reduces the problem of dividing a graph into a large number of pieces (any power of two) to the problem of dividing it into just two pieces. Unfortunately, it results in suboptimal results. For instance, in the circuit layout problem, the first cut may determine which circuit elements will be placed in the top half of the chip and which in the bottom half. Dividing these two halves now determines which elements go into which quadrant of the chip. Unfortunately, since the halves are treated in isolation, this approach ignores the fact that a wire going from the lower left to the upper right is longer than one going from the lower left to the upper left. A similar problem arises in parallel computation. Because of the possibility of message congestion, the number of paths a message must be routed through is a good measure of the cost of the message, but a bisection approach cannot account for this effect.

In either the parallel computing or circuit layout setting, bisection can lead to problems because of its inability to plan ahead. In the circuit layout problem, a better approach would be to divide into four sets at once, explicitly accounting for the different wire lengths between different sets. In parallel computing, it would be best to divide into as many sets at one time as possible, including architectural distance in the optimization metric.

The present invention is of a method to divide a graph into four, eight or sixteen sets at once that incorporates a Manhattan metric between sets. This is precisely the correct metric for circuit layouts since wires are laid down in the horizontal or vertical directions. It is also the correct metric for hypercube or mesh architecture parallel computers due to the possibility of message congestion. Consequently, it produces better mappings to processors than methods based upon bisection strategies.

The prior art approach is known as "spectral bisection", in which an eigenvector of the Laplacian matrix of the graph is used to bisect a graph. See H. Simon, "Partitioning of unstructured problems for parallel processing", in *Proc. Conference on Parallel Methods on Large Scale Structural Analysis and Physics Applications*, Pergammon Press, 1991. Through a novel use of additional eigenvectors, the present invention can divide the graph into four, eight or sixteen pieces using two, three or four eigenvectors respectively. This induces a substantial increase in the complexity of the method, but results in significantly better answers than achievable with spectral bisection.

Previous efforts to divide into more than two sets at once have appeared in the literature. For circuit layouts, a quadrisection method based on locally swapping circuit elements is described in P. Suaris and G. Kedem, "An algorithm for quadrisection and its application to standard cell placement", *IEEE Trans. Circuits and Systems*, 35 (1988), pp. 294–303. A method that uses the eigenvectors of a different matrix to divide a graph into an arbitrary number of sets is described in F. Rendl and H. Wolkowicz, "A projection technique for partitioning the nodes of a graph", Tech Rep. CORR 90–20, University of Waterloo, Faculty of Mathematics, Waterloo, Ontario, November 1990. However, this method requires $2^k$ eigenvectors to divide into $2^k$ sets, whereas the present invention requires only k. Since the calculation of eigenvectors is the dominant computational step in spectral methods, the present approach is much more efficient. In addition, the method of Rendl et al. is unable to account for the notion of different distances between sets. This notion is of central importance in the parallel computing and circuit layout problems.

SUMMARY OF THE INVENTION (DISCLOSURE OF THE INVENTION)

The present invention is of methods and apparatuses for partitioning graphs, particularly for optimizing parallel computations and circuit element placements.

The invention is of a parallel computation planning method and computer system having a plurality of central processing units operating in parallel, comprising: receiving a computational task to be performed by the system; constructing a graph corresponding to the computational task, the graph comprising a plurality of vertices representing a corresponding plurality of computational subtasks of the computational task, and a plurality of weighted edges representing information flow between the computational subtasks; generating a Laplacian matrix of the graph; computing k eigenvectors of the Laplacian matrix, where k>1; selecting an orthogonal basis for a space spanned by the eigenvectors; partitioning the vertices into $2^k$ sets by means of the orthogonal basis; assigning the computational subtasks to at least $2^k$ central processing units in accordance with the partition; and executing the computational subtasks on the at least $2^k$ central processing units according to the assignment. In the preferred embodiment, the invention computes the second and third lowest eigenvectors of the Laplacian matrix. The invention preferably operates recursively, and during each recursion whether the graph is disconnected is determined and, if so, one or more edges is added to the graph so as to render the graph connected.

The invention is also of a circuit design system and method for placing circuit elements on a circuit, comprising: receiving a description of a logical structure of the circuit; constructing a graph representing the circuit, the graph comprising a plurality of vertices representing the circuit elements, and a plurality of edges representing desired connections between the circuit elements; generating a Laplacian matrix of the graph; computing a plurality of eigenvectors of the Laplacian matrix; selecting an orthogonal basis for a space spanned by the eigenvectors; partitioning vertices of the graph into at least four sets by means of the orthogonal basis; assigning the circuit elements to at least four discrete areas of the circuit in accordance with the partition of step f); and placing the circuit elements on the circuit according to the assignment of step g). In the preferred embodiment, the invention computes the second and third lowest eigenvectors of the Laplacian matrix. The invention preferably operates recursively, and during each recursion whether the graph is disconnected is determined and, if so, one or more edges is added to the graph so as to render the graph connected. The invention is also of a circuit manufactured according to the above method.

A primary object of the present invention is to generate balanced partitionings of parallel computations that have lower communication overhead and are less expensive to generate than those produced heretofore.

An additional object of the present invention is to permit placement of circuit elements in quadrants (or more areas) of an integrated circuit so as to minimize total pathway length.

A primary advantage of the present invention is that it is less computationally expensive and produces better results than methods known heretofore.

Another advantage of the present invention is that it automatically works to minimize message contention on hypercube and mesh architectures.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

Figure 1:
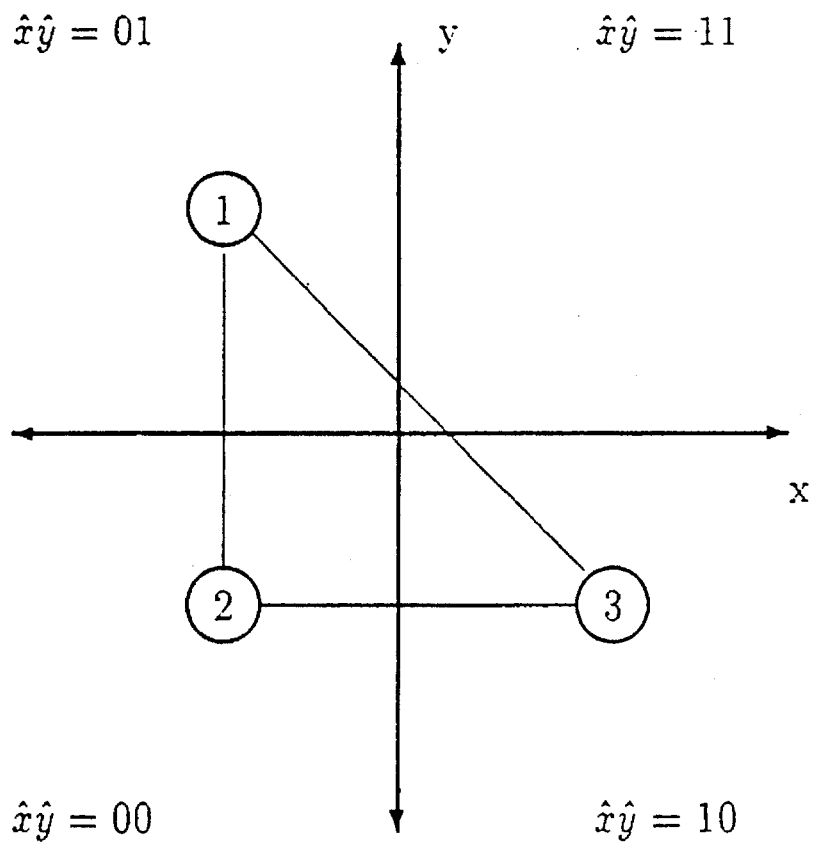
FIG. 1 is a diagram of the function for counting hypercube hops.

DESCRIPTION OF THE PREFERRED EMBODIMENTS (BEST MODES FOR CARRYING OUT THE INVENTION)

The present invention is of a method for the static load balancing of scientific computations. The invention employs k eigenvectors of the Laplacian matrix of a graph to divide the graph into $2^k$ pieces, where $2 \leq k \leq 4$.

In its preferred embodiment, the invention employs the following steps: (1) construction of a Laplacian matrix of a graph; (2) computation of eigenvectors $u_2, \ldots, u_{k+1}$ of the Laplacian matrix; (3) selection of an orthogonal basis for the space spanned by the eigenvectors; (4) using the resulting values to partition into sets; and (5) improving the partitions if desired with a local cleanup procedure. The preferred embodiment is discussed at a high level of generality in the following section and in detail thereafter.

Partitioning Using Multiple Eigenvectors

The "adjacency matrix", A, of a graph G=(V,E) with n vertices is an n×n symmetric matrix. The value of A(i,j) is one if there is an edge between vertices i and j in the graph and zero otherwise. The "degree" of a vertex is the number of edges incident to the vertex. An n×n diagonal matrix D is defined such that element D(i,i) is the degree of vertex i. The "Laplacian matrix", L, of the graph is defined as L=D−A.

The Laplacian matrix has been studied extensively, and has a number of useful properties. B. Mohar, "The Laplacian spectrum of graphs", in 6th *International Conference on Theory and Applications of Graphics*, Kalamazoo, 1988; and "Laplace eigenvalues of graphs—a survey", *Discrete Math.*, 109 (1992), pp. 171–183. The present partitioning method uses a few of the eigenvectors of L. An "eigenvector" is defined as a vector whose direction does not change under the operation of the matrix, hence $Lu_i = \lambda_i u_i$ where $u_i$ is the eigenvector and $\lambda_i$ is a scalar known as the corresponding "eigenvalue". The present invention utilizes the eigenvalues associated with the second, third, fourth and fifth smallest eigenvalues of the matrix. These eigenvectors are denoted $u_2$, $u_3$, $u_4$ and $u_5$, respectively. There are several different methods to compute eigenvectors which are described in, for example, G. Golub and C. Van Loan, *Matrix Computations*, 2d ed., Johns Hopkins University Press, Baltimore, 1989. In practice, an efficient iterative method must be used to solve for the eigenvectors when the graph is very large.

Division of a graph into four sets using eigenvectors $u_2$ and $u_3$ works for any orthogonal basis of the space spanned by these eigenvectors. Division into eight sets with u2, u3 and $u_4$ requires that an additional constraint be enforced. This constraint is $$\sum_{i=1}^{n} x_2(i)x_3(i)x_4(i) = 0 \qquad (1)$$

where the vectors $x_2$, $x_3$ and x4 form a orthogonal basis for the space spanned by the three eigenvectors u2, $u_3$ and $u_4$. This can be accomplished by an optimization calculation over the rotational degrees of freedom in the spanned space. Techniques for such a calculation are described in J. J. Dennis and R. Schnabel, *Numerical methods for unconstrained optimization and non-linear equations*, Prentice-Hall, Inc. Englewood Cliffs, N.J., 1983.

The graph can be divided into sixteen sets using $u_2$, $u_3$, $u_4$ and $u_5$ by finding a orthogonal basis for the space spanned by these eigenvectors in which the following constraints are satisfied:

$$\sum_{i=1}^{n} x_2(i)x_3(i)x_4(i) = 0, \qquad (2)$$

$$\sum_{i=1}^{n} x_2(i)x_3(i)x_5(i) = 0,$$

$$\sum_{i=1}^{n} x_2(i)x_4(i)x_5(i) = 0,$$

$$\sum_{i=1}^{n} x_3(i)x_4(i)x_5(i) = 0, \text{ and}$$

$$\sum_{i=1}^{n} x_2(i)x_3(i)x_4(i)x_5(i) = 0$$

As with octasection, this orthogonal basis can be found by an optimization over the rotational degrees of freedom in the space.

After the rotation, one has k values associated with each vertex in the graph. These values can be thought of as defining a location in k-space for each vertex. The present invention now uses these coordinates to assign each vertex to one of $2^k$ sets. To accomplish this, one first defines the $2^k$ points constructed of k-tuples of values ±1. These k-tuples define the corners of a cube in k-space. The present invention assigns each of the vertices to one of these corners in such a way that each corner gets the same number of vertices, and the sum of the distances between the location of a vertex and the corner to which it is assigned is minimized. This problem can be phrased as an instance of a "minimum weight assignment problem". Efficient methods for solution of such problems are described in T. Tokuyama and J. Nakano, "Geometric algorithms for a minimum cost assignment problem", in *Proc. 7th Annual Symposium on Computational Geometry*, Association of Computing Machinery, 1991, pp. 262–271.

If desired, the resulting partition can be further refined using any local improvement technique. The preferred local refinement scheme is described below.

Multidimensional Spectral Load Balancing

Efficient use of a distributed memory parallel computer requires that the computational load be balanced across processors in a way that minimizes interprocessor communications. This mapping requirement can be abstracted to a graph problem in which vertices represent computation, edges represent communication, and the objective is to assign an equal number of vertices to each processor in a way that minimizes the number of edges crossing between processors. Practical experience has shown that the quality of this mapping can have a substantial impact on performance, hence there is considerable interest in effective mapping methods.

A new heuristic for graph partitioning in the context of mapping parallel computations was recently proposed by Simon, supra. Simon's "spectral" method recursively bisects a graph by considering an eigenvector of an associated matrix to gain an understanding of global properties of the graph.

With one exception, all previous spectral methods for graph partitioning have been based upon the application of recursive bisection, a strategy which is limiting in several important ways. Rendl et al., supra, describes a method for partitioning a graph into an arbitrary number of sets without recursion. However, their method requires that $2^k$ eigenvectors of a matrix representing the graph be determined in order to partition the graph into $2^k$ sets. This renders the method impractical for dividing large graphs into hundreds or thousands of sets, precisely what is required in mapping grand challenge problems onto massively parallel machines. A distinguishing feature of the present invention is that it offers a practical generalization of spectral bisection to allow the division into more than two sets at once. A consequence is that the present invention requires only k eigenvectors to partition into $2^k$ sets. A further consequence is that the present invention is able to use a cost metric for edge crossings which is particularly appropriate in both parallel computing and VLSI circuit layout.

Two methods of the present invention are sometimes referred to herein as "spectral quadrisection" and "spectral octasection", which partition into four sets using two eigenvectors and eight sets using three eigenvectors, respectively. By weighing the effect of several cuts simultaneously, these new methods produce better partitions than spectral bisection, as measured in the "hypercube hop" (or "Manhattan") metric. Empirical study has shown that this is the appropriate measure for modeling the performance of hypercube architecture machines since minimizing this metric corresponds to minimizing congestion within the communication network. S. Hammond, *Mapping unstructured grid computations to massively parallel computers*, PhD thesis, Rensselaer Polytechnic Institute, Dept. of Computer Science, Rensselaer, N.Y., 1992. The hypercube hop metric is similarly appropriate for two- and three-dimensional mesh architectures (with or without wrap-around torus connections). Most distributed-memory parallel machines have either mesh or hypercube architectures, so these new methods have wide application.

In addition to producing better partitions, the multidimensional spectral methods of the present invention have two other significant advantages. First, the logarithmic relationship between the number of required eigenvectors and the number of partitions means that in practice the multidimensional methods require less net computation than spectral bisection to define the same number of partitions. Second, by exploiting available redundancy in the solution space, multidimensional spectral methods are able to correctly partition highly symmetric graphs which are problematic for spectral bisection. Load balancing methods based on spectral quadrisection and octasection are thus generally more powerful, efficient and robust than those based on spectral bisection.

Various formulations of spectral bisection can be found in the prior art, including Simon, supra; R. Bopana, "Eigenvalues and graph bisection: An average case analysis", in

*Proc. 28th Annual Symposium on Foundations of Computer Science*, IEEE, 1987, pp. 280–285; and A. Pothen, H. Simon, and K. Liou, "Partitioning sparse matrices with eigenvectors of graphs", *SIAM J. Matrix Anal.* 11 (1990), pp. 430–452. A typical version of the method follows. Define the graph G by vertex set V and edge set E. Index the n vertices with i or j, so $V_i$ refers to the vertex with index i, $E_{ij}$ denotes an extant edge between $V_i$ and $V_j$, and $\Sigma_{V_i}$ and $\Sigma_{E_{ij}}$ specify sums over the vertices and existing edges, respectively. Now assign a variable $x_i$ to each $V_i$ such that $x_i=\pm 1$ and $\Sigma_{V_i} x_i = 0$. The first condition stipulates a partition into to distinct sets. The second requires that the sets be of equal size, assuming an even number of vertices. A vector x whose elements satisfy these conditions is an "indicator" vector since it indicates the set assignment of each graph vertex.

The next step is to notice that the function $f(x)=¼\Sigma_{E_{ij}}(x_i-x_j)^2$ counts the number of edges crossing between sets since $(x_i-x_j)^2$ contributes nothing to the sum if $x_i$ and $x_j$ have the same sign, and contributes four if they have opposite sign. The method next converts the objective function f(x) to matrix form since that will make the solution more apparent. One starts by defining the adjacency matrix $$A_{ij} = \begin{cases} 1 & \text{if } (V_i, V_j) \in E \\ 0 & \text{otherwise.} \end{cases} \quad (3)$$

One also defines the "degree matrix" $D=\text{diag}(d_i)$, where $d_i$ is the graph degree of $V_i$, i.e., the number of edges incident upon vertex $V_i$.

The conversion then proceeds as follows. Write $$\sum_{E_{ij}} (x_i - x_j)^2 = \sum_{E_{ij}} (x_i^2 + x_j^2) - \sum_{E_{ij}} 2x_i x_j. \quad (4)$$

and recast the terms $$\sum_{E_{ij}} 2x_i x_j = \sum_{V_i}\sum_{V_j} x_i A_{ij} x_j = \sum_{V_i} x_i \sum_{v_j} A_{ij} x_j = x^T A x. \quad (5)$$

$$\sum_{E_{ij}} (x_i^2 + x_j^2) = \sum_{E_{ij}} 2 = 2|E| = \sum_{V_i} x_i^2 d_i = x^T D x. \quad (6)$$

Now define the "Laplacian matrix" of the graph G as $$L_{ij} = \begin{cases} -1 & \text{if}(V_i, V_j) \in E \\ d_i & \text{if } i = j \\ 0 & \text{otherwise,} \end{cases} \quad (7)$$

and note that $L(G)=D-A$, and conclude $f(x)=¼x^T L x$. Coupling this with the constraints on x one defines the "discrete bisection problem" as Minimize $¼x^T L x$ Subject to: $x^T 1=0$, $x_i=\pm 1$, (8)

where 1 is the n-vector $(1,1,1,\ldots)^T$. Since graph partitioning is an NP-hard problem, one expects that there is no practical way to solve this problem. Undeterred, one relaxes the discreteness constraint on x and defines the "continuous bisection problem" as Minimize $¼x^T L x$ Subject to: $x^T 1=0$, $x^T x=n$, (9)

in which the elements of x may take on any values satisfying the norm constraint. This continuous problem is only an approximation to the discrete problem, and the values defining its solution must be mapped back to $\pm 1$ by some appropriate scheme to define a partition. Let us emphasize that the relaxation of the discreteness constraint is the crucial approximation in application of spectral methods to graph partitioning. Ideally, the solution to the continuous problem will have entries clustered near $\pm 1$ so that it is a good approximation to the discrete problem.

One now begins the solution of (9) by noting that the Laplacian matrix has several important properties. If $u_1, u_2, \ldots, u_n$ are the normalized eigenvectors of L with corresponding eigenvalues $\lambda_1 \leq \lambda_2 \leq \ldots \leq \lambda_n$, the following theorem is proved in B. Hendrickson and R. Leland, "An improved spectral graph partitioning algorithm for mapping parallel computations", Tech Rep. SAND 92-1460, Sandia National Laboratories, Albuquerque, N. Mex., 1992 (hereinafter "SAND 92-1460"), which is herein incorporated by reference.

THEOREM 1. The matrix L has the following properties.

(I) L is symmetric positive semi-definite.

(II) The $u_i$ are pairwise orthogonal.

(III) $u_1=n^{-½}1$, $\lambda_1=0$.

(IV) If G is connected, then $\lambda_1$ is the only zero eigenvalue of L.

Next express x in terms of the eigenvectors of L: $x=\Sigma_i \alpha_i u_i$ where the $\alpha_i$ are real constants such that $$\sum_{i=1}^{n} \alpha_i^2 \quad (10)$$

Property II ensures that this is always possible since a set of n pairwise orthogonal vectors must span $\mathbb{R}^n$. By substitution of x one finds $$f(x)=¼(\alpha_2^2 \lambda_2 \alpha_3^2 \lambda_3 + \ldots + \alpha_n^2 \lambda_n) \quad (11)$$

since $\lambda_1=0$. Clearly $$(\alpha_2^2+\alpha_3^2+\ldots+\alpha_n^2)\lambda_2 \leq \alpha_2^2 \lambda_2 + \alpha_3^2 \lambda_3 + \ldots + \alpha_n^2 \lambda_n, \quad (12)$$

given the ordering of the eigenvalues, so $f(x) \leq n\lambda_2/4$. Notice that one can achieve $f(x)=n\lambda_2/4$ by choosing $x=u_2\sqrt{n}$. Notice also that this choice of x satisfies the balance constraint since $$x^T 1 = u_2^T u_1 = 0 \quad (13)$$

by properties II and III. Therefore, since $x=u_2\sqrt{n}$ satisfies the constraints and minimizes f(x), it is a solution to the continuous problem. If $\lambda_2 \neq \lambda_3$, this solution is unique ($x=u_2\sqrt{n}$ defines the same partition).

There remains the task of mapping the solution of the continuous problem to a discrete partition. In the case of bisection there is a simple and natural way to do this.

Find the median of the $x_i$ values and then map vertices with corresponding $x_i$ above the median to one set, and those below to the other. If several vertices share the median value they are assigned in a way that retains balance. This solution is the nearest discrete point to the continuous optimum.

An immediate corollary of the reasoning used to solve the continuous minimization problem is that $n\lambda_2/4$ is a lower bound on the number of cuts produced by any balanced partitioning of the graph. That is because the solution space of the continuous problem subsumes the solution space of the discrete problem.

A theoretical result of more practical interest involves a theorem due to M. Fiedler, "Algebraic connectivity of graphs", *Czechoslovak Math. J.* 23 (1973), pp. 298–305; and "A property of eigenvectors of non-negative symmetric matrices and its application to graph theory", *Czechoslovak Math. J.* 25 (1975), pp. 619–633. This says that following a bisection if the median value is larger than zero, then the subgraph consisting of all lower valued vertices is connected. Similarly, if the median value is less than zero, then the subgraph consisting of all higher valued vertices is connected. In both cases the other subgraph may be disconnected.

A disconnected subgraph is problematic because the method is to be applied recursively, and the method can fail badly if applied to a disconnected graph since Theorem 1(IV) breaks down. One therefore must monitor connectivity of the subgraphs at each stage of recursion. If a disjoint subgraph is detected, one adds a minimal number of "phantom edges" to establish connectivity, partitions this subgraph and then removes the phantom edges. One finds that in practice several subgraphs do become disconnected in the course of the partitioning of a typical large graph, and the phantom-edge strategy does noticeably improve overall results in those cases.

In order to partition a graph into four sets the present invention employs a second indicator vector, y, so that one can associate two bistate coordinates with each vertex. To make set assignment explicit, the present invention defines a mapping from the indicator vector to binary digits $$\hat{x}_i = \frac{1}{2}(x_i - 1), \hat{y}_i = \frac{1}{2}(y_i - 1) \quad (14)$$

and then assigns $v_i$ to set 0, 1, 2 or 3 by interpreting $\hat{x}_i, \hat{y}_i$ as a binary number. The question is then how one should choose x and y in order to achieve a good mapping.

Consider the objective function $f(x,y) = \frac{1}{2}(x^T L x + y^T L y)$. This counts hypercube hops, as illustrated in FIG. 1. To understand this, notice that $E_{1,2}$, which crosses the $x=0$ plane, contributes 1 to the value of $f(x,y)$ through the $x^T L x$ term. Similarly, $E_{2,3}$ crosses the $y=0$ plane and contributes 1 to $f(x,y)$ through the $y^T L y$ term. An edge like $E_{1,3}$, however, crosses both planes and hence contributes 2 to the value of $f(x,y)$.

Figure 2:
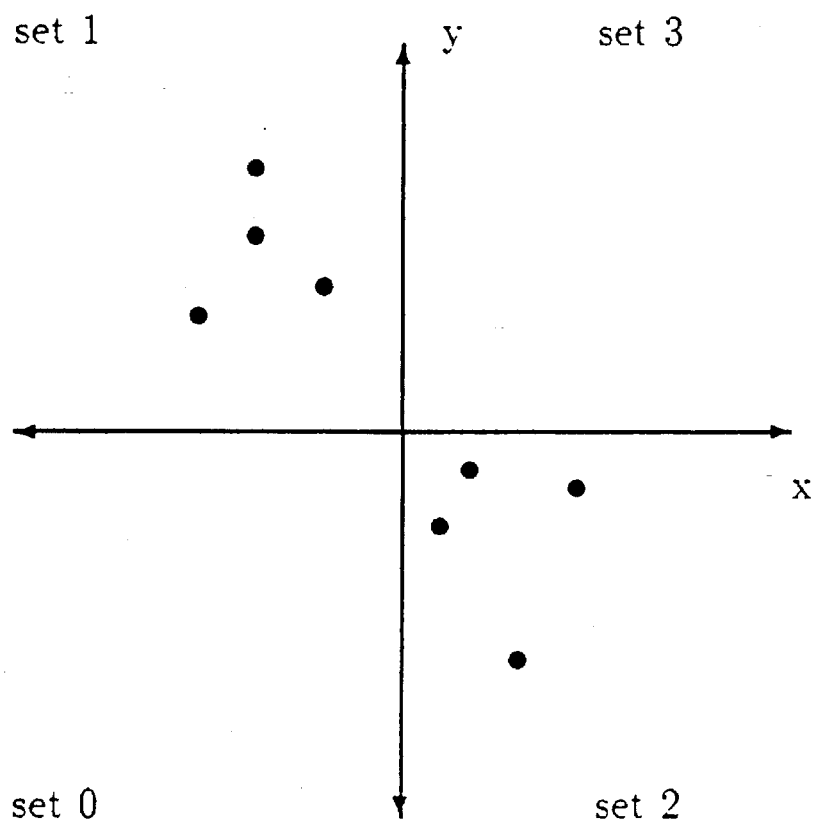
FIG. 2 is a diagram of an undesired node distribution prevented by the present invention.

One also needs to revise the minimization constraints. In the continuous bisection problem one had the single constraint $x^T 1 = 0$ to ensure load balance in the x indicator vector. In the quadrisection method of the present invention one needs to add $y^T 1 = 0$ to ensure balance in the y indicator vector. A less obvious but necessary constraint proved in SAND 92-1460 is that $\Sigma_V x_i y_i = x^T y = 0$. This constraint serves to prevent a node distribution like that shown in FIG. 2. Which is balanced with respect to both $x=0$ and $y=0$ planes independently, but does not represent four balanced sets; a correct partitioning would assign two nodes to each quadrant.

Note that by way of physical analogy with a point-mass distribution, the $x^T 1 = 0$ and $y^T 1 = 0$ constraints specify a coordinate system in which the origin is placed at the center of mass. One can extend the analogy by considering the inertia tensor $$T = \begin{pmatrix} \sum_{V_i} y_i^2 & -\sum_{V_i} x_i y_i \\ -\sum_{V_i} x_i y_i & \sum_{V_i} x_i^2 \end{pmatrix} \quad (15)$$

The $x^T y = 0$ constraint combined with norm constraints $x^T x = y^T y = n$ stipulate a distribution in which T is a constant multiple of the identity matrix, i.e., there is no preferred axis of rotation. Intuitively, these conditions describe a roughly spherical mass distribution which is divided naturally into four balanced sets by the orthogonal axes. One might infer that for higher dimensional partitions one must specify that higher moments are zero in order to preserve balance. This is in fact the case, as proven algebraically in SAND 92-1460.

With these amendments, one can follow the same progression from discrete to continuous model used in the bisection case and the continuous quadrisection problem is as follows:

Minimize $\frac{1}{4}(x^T L x + y^T L y)$ Subject to: $x^T 1 = y^T 1 = x^T y = 0$, $x^T x = y^T y = n$. (16)

The solution of Eq. (16) is as follows: One first notes that if x and y are chosen to be any pair of distinct eigenvectors of L not including $u_1$ and scaled by $\sqrt{n}$, the constraint equations are all satisfied. That is because, by Theorem 1, all such eigenvectors are orthogonal and are also orthogonal to $u_1 \sqrt{n} = 1$. By extension of the algebraic argument used in Eq. (12) for the bisection case, one can prove that the minimum possible value of $f(x,y) = n(\lambda_2 + \lambda_3)/4$ is obtained by setting $x = u_2 \sqrt{n}$ and $y = u_3 \sqrt{n}$, and that $n(\lambda_2 + \lambda_3)/4$ is a lower bound on the number of hops induced by any balanced partition into four sets. This is a special case of the general solution theorem proved in SAND 92-1460.

Notice that if one sets $x = u_2 \sqrt{n} \cos\theta + u_3 \sqrt{n} \sin\theta$ and $y = u_2 \sqrt{n} \sin\theta + u_3 \sqrt{n} \cos\theta$, then x and y still satisfy the constraint equations and also produce the same minimum value of $f(x,y)$. Hence there is actually a family of solutions to Eq. (16) corresponding to the various choices of the free parameter $\theta$. Different values of $\theta$ correspond to different solutions to the continuous problem that have the same objective function value but specify different partitionings. An obvious question is therefore how one might exploit this rotational degree of freedom to advantage. One does so by choosing $\theta$ in a way that partially recovers the accuracy lost when the discrete optimization model was relaxed to the continuous one. That is, one attempts to minimize the discrepancy between the two models by making the continuous optimums as nearly discrete as possible. Specifically, one minimizes $$g(\theta) = \sum_{V_i} (1 - x_i^2)^2 + (1 - y_i^2)^2 \text{ over } \theta \in (0, 2\pi). \quad (17)$$

After substituting the trigonometric expansions for x and y, this reduces to minimizing a constant coefficient quartic equation in sines and cosines of $\theta$. The construction of the coefficients in this equations requires O(n) work, but the cost of the resulting minimization problem is independent of n and is not significant when partitioning large graphs. This is actually a global optimization, but usually the number of values of $\theta$ corresponding to local minima is small, so a good solution can be found in most cases by a short sequence of local minimizations from random starting points.

As in spectral bisection, there remains the problem of mapping the continuous, rotated solution back to discrete space. Unfortunately a simple generalization of the median technique used there is no longer adequate. The present guiding principle is once again to find the discrete solution nearest the continuous optimum. First one defines a distance function from a continuous point $(x_i, y_i)$ to discrete point $(\pm 1, \pm 1)$. One must assign one fourth of the continuous points to each of the discrete points in such a way that the sum of the distances from the continuous values to their discrete assignments is minimized. This is an instance of a "minimum cost assignment problem", for which efficient methods are known. In the preferred embodiment of the present invention, the method from T. Tokuyama et al., supra, that runs in O(nlog(n)) time is employed.

The development of the octasection method follows closely that of quadrisection. One defines a third indicator vector z mapped to a bit by $$\hat{z}_i = \frac{1}{2}(z_i - 1) \quad (18)$$

and assigns each $v_i$ to one of eight sets by interpreting $\hat{x}_i, \hat{y}_i, \hat{z}_i$ as a binary number. One then minimizes the function $$f(x,y,z) = \frac{1}{4}(x^T L x + y^T L y + z^T L z) \quad (19)$$

which counts hypercube hops on a three dimensional cube. To retain balance one must do this subject to the additional constraint that a particular third moment of the distribution is zero, i.e., $\Sigma_{V_i} x_i y_i z_i = 0$. (The physical analogy with mass distribution does not extend easily, although it is still true that the inertial tensor is a multiple of the identity.) Relaxing the discreteness constraint as before, one arrives at the continuous octasection problem:

Minimize $\quad 1/4(x^T L x + y^T L y + z^T L z)$ (20)

Subject to: $\quad x^T 1 = y^T 1 = z^T 1 = x^T y = x^T z = y^T z = \sum_{V_i} x_i y_i z_i = 0,$ $x^T x = y^T y = z^T z = n.$ Ignoring temporarily the third moment constraint, one solution of the problem is $x = u_2 \sqrt{n}$, $y = u_3 \sqrt{n}$ and $z = u_4 \sqrt{n}$ with corresponding minimum (and hence lower bound on the number of hops induced by any balanced partition into eight sets) of $n(\lambda_2 + \lambda_3 + \lambda_4)/4$. Again there is redundancy in the solution space since any rotation of these eigenvectors generates another solution of equal value. Since one is working in three-dimensional space, there are three rotational degrees of freedom. The present invention uses this freedom to now satisfy the triple product constraint while, as in quadrisection, also trying to make the continuous optimum as nearly discrete as possible. This yields a constrained optimization problem in three variables involving a constant coefficient quartic polynomial in sines and cosines of the angular parameters. The coefficients are computed in O(n) time, after which the cost of the minimization is independent of n. The continuous, rotated solution is then mapped back to a discrete solution using the same method for the minimum cost assignment problem employed in spectral quadrisection.

If a d-dimensional partitioning scheme divides a mesh into $2^d$ parts at once, the specification has presented spectral schemes for $1 \leq d \leq 3$, only d=1 which was known heretofore. Although some of the implementation details become more difficult, these ideas extend naturally to the d=4 case. When d>4 the moment constraints outnumber the rotational degrees of freedom, so it will not generally be possible to construct a balanced partition from eigenvectors 1 ... d+1 of L (see SAND 92-1460).

As the results reported in the Example will show, the spectral partitioning methods of the present invention typically produce better partitions than competitive methods. This success is due to their ability to find promising regions of the graph in which to cut. However, this global strength is combined with a local weakness. Spectral methods often do poorly in the fine details of a partition. This observation suggests that spectral methods could be improved by coupling them with a heuristic to improve the partition locally.

One such heuristic is the graph bisection method due to Kernighan and Lin (KL). B. Kernighan and S. Lin, "An efficient heuristic procedure for partitioning graphs", *Bell System Technical Journal* 29 (1970), pp. 291–307. This method is quite good at finding locally optimal answers, but unless it is initialized with a good global partition, the local optimum can be far from the best possible. The synergy between the global strength of spectral methods and the local finesse of KL leads to a method that is significantly better than either alone.

The KL method has an outer loop that continues as long as improved partitions are being discovered. Each outer loop begins by computing a preference value q for each vertex. The preference value is the reduction in the number of edges between the two sets if the vertex were to switch sets. That is, $$q(V_i) = \sum_{(V_i, V_j) \in E} \begin{cases} 1 & \text{if } P(V_i) \neq P(V_j) \\ -1 & \text{otherwise,} \end{cases} \quad (21)$$

where $P(V)$ is the current partition for vertex $V_i$. The method then enters a loop in which it swaps two vertices between partitions, and updates the preference values of their neighbors. It always swaps the vertices with the largest preferences, and once a vertex is moved, it is not reconsidered. After each swap, the resulting partition is evaluated and the best one encountered is recorded and becomes the new partition upon exiting the inner loop. Note that since vertices are simply swapped, if the initial partition is balanced then all generated partitions will be balanced as well. Each of these outer loops can be implemented to run in time proportional to the number of edges in the graph. See C. M. Fiduccia and R. M. Mattheyses, "A linear-time heuristic for improving network partitions", in *Proc. 19th Design Automation Conf.*, IEEE, 1982, pp. 175–181. In practice, the number of passes required is quite small, usually fewer than 5, so the method is effectively linear time. It also requires space proportional to the number of vertices in the graph. The following pseudocode specifies the method in detail:

Until no better partition is discovered
  Best Partition:=Current Partition
  $S_1$:=Vertices in Partition 1
  $S_2$:=Vertices in Partition 2
  For All $V_i$
Compute preference value q(i)
While
  $S_1$ is not empty and $S_2$ is not empty
  $V_i$:=vertex in $S_1$ with largest preference
  $P(V_i)$:=2
  $S_1$:=$S_1 \backslash V_i$
  Update preferences of neighbors of $V_i$
  $V_j$:=vertex in $S_2$ with largest preference
  $P(V_j)$:=1
  $S_2$:=$S_2 \backslash V_j$
Update preferences of neighbors of $V_j$
  If Current Partition better than Best Partition Then
  Best Partition:=Current Partition
  Current Partition:=Best Partition The present spectral quadrisection and octasection methods divide a graph into four or eight pieces at once, so a local refinement of these partitioning methods should be able to handle more than just two sets. A generalization of KL to four sets is described for circuit layout problems by Suaris et al., supra, and the present invention extends this idea to an arbitrary number of sets. In addition, one is interested in minimizing the total number of hops spanned by graph edges spanning different processors, so one wants a refinement method that can handle arbitrary cost metrics for edges connecting different partitions.

The preferred local refinement method of the present invention generalizes Kernighan-Lin to address these issues, and is hereinafter referred to as GKL. The present method differs from the original KL in several ways. First, instead of a single value, preferences need to be computed for a vertex transfer to any of the other sets, values one denotes by $q^k(i)$. Second, the preference values include a factor for the inter-set metric, which for the present purposes is chosen to be the hop metric. Third, moves are made singly instead of in pairs, since one might now want to move vertices in something other than a strict swap fashion. Fourth, unlike the original KL method, partitions can be generated that are not balanced, so move selection tries to encourage the generation of balanced sets. This is accomplished by considering only moves from sets of at least average size to those that are at or below average size. And fifth, since intermediate partitions can be unbalanced, partitions are only considered for recording if they satisfy a balance criteria. The GKL method is set forth in pseudocode below. For sets, this method can be implemented to run in $O(\eta^2|E|)$ time and requires $O(\eta|V|)$ space.

Until no better partition is discovered
    Best Partition:=Current Partition
    For All $k \in \{1, \ldots, \eta\}$, $S_k$:=Vertices in Partition k
    For All $V_i$
Compute $\eta-1$ preferences $q^k(i)$
While allowed moves exist
    $V_i$:=vertex with largest allowed preference
    l:=set vertex $V_i$ wants to go to
    $S_{P(V_i)}$:=$S_{P(V_i)} \setminus V_i$
    $P(V_i)$:=l
Update preferences of neighbors of $V_i$
    If Current Partition balanced and better than
    Best Partition Then
    Best Partition:=Current Partition
    Current Partition:=Best Partition Graph Construction Constructing graphs to be partitioned by the method of the invention is, of course, necessary before a problem represented by the graph can be solved. The graph representing a circuit is closely related to the electrical connections between circuit elements. A vertex is needed for each logic unit, and an edge connects any pair of vertices that are in the same net list. If desired, edge weights can be used, and the weights of edges set to the number of circuit elements in the particular net list. Mapping a computation to a graph may be done in a number of ways, but the following approach is preferred for computations to be executed by a parallel processing computer. Note that the circuits may be two or three dimensional, may or may not be integrated, and may involve transfer of information and energy electrically, optically, or by other means known or to become known in the art. The present invention is particularly of use for two-dimensional integrated circuits having electrical or optical conductive pathways, such as silicon-based chips and AlGaAs-based optical integrated circuits, to divide the circuits into quadrants. Smaller subdivisions of the circuits for element placement is, of course, possible with the present invention.

Most computations benefitting from parallel processing involve repeated iterations of the same cycle of computations. Although it is sometimes possible to achieve parallelism by effectively overlapping multiple iterations, the more common approach is to exploit parallelism within each iteration. Within an iteration, a processor performs a set of computations followed by a set of communication operations, and because each iteration involves the same set of operations, it is sufficient to distribute the task among processors based upon the requirements of a single iteration.

It is therefore preferred to represent a computation as an undirected, weighted graph G=(V,E), using n to denote the size of the vertex set V, and m the size of the edge set E. Each vertex $v_i \in V$ corresponds to a computational task to be performed on a single processor, and the time required to execute that task is represented by a positive weight $w_v(v_i)$.

An undirected edge $e_{ij} \in E$ connects two vertices $v_i$ and $v_j$ if the computational task represented by one of the vertices requires input from the other. The edge has an associated positive weight $w_e(e_{ij})$ proportional to the amount of data that must be transmitted between the tasks. If each task requires data from the other, then this weight is the sum of the two amounts of information.

Partitioning a computational task among the processors corresponds to assigning each vertex f the graph to a processor. The sum of the weights of the vertices assigned to a processor represents the amount of computational efforts that processor must expend, and the sum of the weights of all the edges connecting vertices assigned to two different processors represents the total amount of information that must be communicated between the two.

The present application has described a graph partitioning method that is well suited to partitioning unstructured grids for problems in scientific computation. The method of the present invention generalizes spectral bisection to allow for the division into four, eight, or sixteen sets at once. This multidimensional approach is faster than spectral bisection, and explicitly accounts for message congestion in mesh, torus or hypercube architectures.

The present invention is also useful in network design, sparse matrix computations, and a number of other disciplines. Computer apparatuses, both parallel and non-parallel, incorporating the invention are therefore expected to be found in a number of scientific disciplines and, of course, in a wide range of future products necessarily performing computationally expensive tasks (e.g., flight simulators having virtual reality elements, real-time expert systems, and the like).

Industrial Applicability:

The invention is further illustrated by the following non-limiting examples.

The present invention was implemented and applied to graphs underlying finite element and finite difference techniques for solving partial differential equations (PDEs). These are the appropriate graphs to partition when solving PDEs on parallel computers. The same graphs were also partitioned using two of the most popular methods in the parallel computing community, the inertial method and spectral bisection. A series of experiments were performed to compare the present recursive spectral quadrisection (RSQ) and recursive spectral octasection (RSO) methods with recursive spectral bisection (RSB) and another bisection method in common use, the inertial method proposed by Nour-Omid, discussed in Simon, supra. The results shown in Table 1 are typical.

The first example grid is a two-dimensional finite element meshing of a multi-element airfoil provided by Barth and Jesperson of NASA Ames which has been commonly used in testing partitioners; the experiment involved constructing and partitioning the dual (|V|=8034,|E|=11813) of this mesh since that is more appropriate for some finite element calculations. The second example grid is another two-dimensional CFD mesh generated by Hammond at the Research Institute for Advanced Computer Science, NASA Ames (|V|=4720, |E|=13722). The third example grid is a three-dimensional finite difference mesh of a complex manufacturing component generated by Sandia National Laboratories (|V|=6661, |E|=55600). Table 1 shows the results obtained when four partitioning methods were used to divide each sample mesh into eight pieces. The methods are listed in rank order by hop count, which, as earlier mentioned, has been shown to closely correlate with the overhead due to communication for these sorts of applications. Also shown is another common measure of partition quality, the number of cuts, i.e., the total number of edges crossing between processor sets. Division into more than eight sets can be accomplished by recursive application of any of these methods.

The suffix GKL in RSOGKL refers to appending the generalized Kernighan-Lin (GKL) method of the invention, described above, to the spectral output. The resulting partition is clearly the best with respect to both hops and cuts. Notice also that the cut and hop totals are nearly equal for this method, indicating that most communication is between neighboring processors.

TABLE 1

Performance of partitioning methods on sample meshes.

| Method | Barth Mesh | | Hammond Mesh | | Sandia Mesh | |
|---|---|---|---|---|---|---|
|  | cuts | hops | cuts | hops | cuts | hops |
| Inertial Method | 317 | 396 | 880 | 1349 | 4652 | 5594 |
| Spectral Bisection (RSB) | 212 | 286 | 469 | 772 | 3425 | 5084 |
| Spectral Octasection (RSO) | 221 | 224 | 439 | 453 | 4138 | 4735 |
| Spectral Octasection & GKL (RSOGKL) | 197 | 200 | 422 | 425 | 3140 | 3420 |

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all publications cited above are hereby incorporated by reference.

What is claimed is:

1. A parallel computational system optimized to solve a given problem, comprising:
   a) a plurality of computational units;
   b) data links connecting pairs of said computational units, said datalinks defining the connection topology of said parallel computational system, and;
   c) a procedure to subdivide the given problem among the plurality of computation units, said procedure comprising;
      i) constructing a graph corresponding to the given problem, said graph comprising a plurality of vertices representing a corresponding plurality of computational subtasks of the given problem, and a plurality of weighted edges representing information flow between the computational subtasks;
      ii) generating a Laplacian matrix of said graph;
      iii) computing k eigenvectors of said Laplacian matrix, k being an integer greater than 1;
      iv) selecting an orthogonal basis for a space spanned by the eigenvectors;
      v) partitioning said computational subtasks into $2^k$ subsets by means of the orthogonal basis, and;
      vi) assigning each of said subsets of computational subtasks to at least one of said computational units in a manner consistent with the connection topology.

2. A method to design a circuit board which optimizes the interconnections between circuit elements within a given logical circuit structure, the method comprising the steps of:
   a) constructing a graph representing the given logical circuit structure, said graph comprising a plurality of vertices representing the circuit elements, and a plurality of edges representing connections between said circuit elements;
   b) subdividing the given logical circuit structure among a set of at least four subcircuits, said subdivision comprising;
      i) generating a Laplacian matrix of the graph;
      ii) computing k eigenvectors of said Laplacian matrix, k being an integer greater than 1;
      iii) selecting an orthogonal basis for a space spanned by the eigenvectors;
      iv) partitioning vertices of the graph into at least four subsets by means of the orthogonal basis;
      v) assigning each of said subsets c,f vertices to at least one of said subcircuits, and;
   c) designing and constructing a circuit board to implement said subdivision.

3. A circuit manufactured according to the method of claim 2.

4. A method of controlling a parallel computer for efficient operation on a task,
   a) where the parallel computer comprises a plurality of processing elements and a plurality of communication links connecting the processing elements in a connection topology, and
   b) where the task is divided into a plurality of subtasks, where each subtask communicates information to one or more other subtasks,
   c) said method comprising:
      i) constructing a graph corresponding to the task and comprising a plurality of vertices representing the subtasks and a plurality of weighted edges representing information communicated between subtasks;
      ii) generating a Laplacian matrix of the graph;
      iii) determining k eigenvectors of the Laplacian matrix, where k is an integer greater than 1;
      iv) selecting an orthogonal basis for a space spanned by the eigenvectors;
      v) partitioning the subtasks into $2^k$ subsets by means of the orthogonal basis; and
      vi) assigning each of the subtasks to at least one of the processing elements consistent with the connection topology.

5. The method of claim 4 wherein step c iii) comprises computing eigenvectors $\lambda_2$ through $\lambda_{k+1}$ of the Laplacian matrix, where $\lambda_{k+1} \geq \lambda_k$ and $4 \geq k \geq 2$.

6. The method of claim 4 where the steps contained within step c are performed recursively.

7. The method of claim 6 wherein step c additionally comprises the step of determining if the graph is disconnected.

8. The method of claim 7 wherein step c additionally comprises the step of adding to the graph one or more edges to render the graph connected.

9. A method of placing a plurality of circuit elements of a logical circuit structure on a substrate so that the cost of connections between the elements is minimized, comprising:
   a) constructing a graph representing the logical circuit structure, comprising a plurality of vertices representing the elements and a plurality of edges representing connections between the elements;

b) generating a Laplacian matrix of the graph;

c) determining k eigenvectors of the Laplacian matrix, where k is an integer greater than 1;

d) selecting an orthogonal basis for a space spanned by the eigenvectors;

e) partitioning the vertices of the graph into at least four subsets by means of the orthogonal basis;

f) assigning each of the subsets to at least one subcircuit;

g) assigning the subcircuits to regions of the substrate;

h) determining each element's corresponding subcircuit; and i) placing the elements on the substrate in regions assigned to their corresponding subcircuit.

10. The method of claim 9 wherein step c comprises computing eigenvectors $\lambda_2$ through $\lambda_{k+1}$ of the Laplacian matrix, where $\lambda_k \leq \lambda_{k+1}$ and $2 \leq k \leq 4$.

11. The method of claim 9 wherein steps a through f are performed recursively.

12. The method of claim 11 additionally comprising the step of determining whether the graph is disconnected.

13. The method of claim 12 additionally comprising the step of adding to the graph one or more edges to render the graph connected.

* * * * *